United States Patent [19]

Takafuji et al.

[11] Patent Number: 4,746,628
[45] Date of Patent: May 24, 1988

[54] METHOD FOR MAKING A THIN FILM TRANSISTOR

[75] Inventors: Yutaka Takafuji; Kohhei Kishi, both of Nara; Kohzo Yano, Yamatokoriyama, all of Japan

[73] Assignee: Sharp Kabushiki Kaisha, Osaka, Japan

[21] Appl. No.: 902,114

[22] Filed: Aug. 29, 1986

Related U.S. Application Data

[62] Division of Ser. No. 643,354, Aug. 22, 1984, abandoned.

[30] Foreign Application Priority Data

Aug. 26, 1983 [JP] Japan ................. 58-156748

[51] Int. Cl.[4] ................. H01L 21/225; H01L 21/385; H01L 21/44; H01L 21/48
[52] U.S. Cl. ................. 437/160; 437/101; 437/187; 357/2; 357/4; 357/23.7; 148/DIG. 3; 148/DIG. 1
[58] Field of Search ................. 357/23.7, 4, 2; 148/1.5, 188, DIG. 3; 29/571, 578; 437/187, 160, 101

[56] References Cited

U.S. PATENT DOCUMENTS

| 3,671,820 | 6/1972 | Haering et al. | 357/23.7 |
| 4,313,809 | 2/1982 | Benyon Jr. et al. | 29/571 |
| 4,332,075 | 6/1982 | Ota et al. | 29/571 |
| 4,332,076 | 6/1982 | Solo de Zaldivar | 148/188 |
| 4,343,081 | 8/1982 | Morin et al. | 148/188 |
| 4,381,957 | 5/1983 | Punter et al. | 148/188 |
| 4,389,768 | 6/1983 | Fowler et al. | 29/571 |
| 4,398,340 | 8/1983 | Brown | 29/578 |
| 4,425,572 | 1/1984 | Takafuji et al. | 357/4 |

FOREIGN PATENT DOCUMENTS 0061183  4/1984  Japan ................. 357/23.7

OTHER PUBLICATIONS

*J. Electrochem. Soc. Solid State Science*, Sep. 1971, vol. 118, No. 9, pp. 1463–1468. "High Temperature Annealing of Oxidized Silicon Surface", by F. Montillo et al.

*Primary Examiner*—Brian E. Hearn
*Assistant Examiner*—M. Wilczewski
*Attorney, Agent, or Firm*—Birch, Stewart, Kolasch & Birch

[57] ABSTRACT

A thin film transistor (TFT) of a self-aligned structure, wherein a pair of a source electrode and a drain electrode are formed in alignment with a gate electrode and in contact with low resistance areas formed at both side portions of a semiconductor layer deposited on an insulating substrate. The low resistance areas are formed by the diffusion of metal atoms through heat-treatment.

13 Claims, 3 Drawing Sheets

METHOD FOR MAKING A THIN FILM TRANSISTOR

This application is a divisional of application Ser. No. 643,354, filed on Aug. 22, 1984, now abandoned.

BACKGROUND OF THE INVENTION

1. Field of the Invention

The present invention relates to an insulated gate field effect transistor of a self-aligned structure which uses a thin film layer made of amorphous silicon, microcyrstalline silicon or polycrystalline silicon, etc., and more particularly, to a structure of the above thin film transistor (hereinafter referred to as a TFT) and a method for making the same which can greatly simplify the process thereof and highly maintain the pattern accuracy of source drain electrodes with respect to a gate electrode.

2. Description of the Prior Art

Generally, as shown in FIG. 1, a thin film transistor (TFT) using amorphous silicon (hereinafter referred to as a-Si) is constructed in such a manner that after a gate electrode 2 is formed on an insulating substrate 1 made of glass or the like, an insulator film 3 is coated thereon. Then, an a-Si layer 4 is deposited on the insulator film 3. Thereafter, a source electrode 5 and a drain electrode 6 are formed such that their edge portions partly overlap and contact with the a-Si layer 4. For the gate electrode 2, metal such as Al, Ni-Cr or Mo is employed. For the gate insulator film 3, $SiO_2$ film or $Si_3N_4$ film which is obtained by, for example, a chemical vapor deposition method (CVD method) or by a plasma CVD method is employed. Generally, the a-Si layer 4 is deposited onto the gate insulator film 3 by glow-discharge decomposition of $SiH_4$. In addition, both the source electrode 5 and drain electrode 6 may also be formed by an n+a-Si film etc.

When the thin film transistor (TFT) of the above described type is used in an address element in a matrix-type liquid crystal display device, it is necessary to align the pattern of the semiconductor layer and the source drain electrodes with a predetermined gate pattern over a wide area with a very high precision, such as in the order of less than several micrometers. Thus, the positioning of such electrodes also must be done with a very high accuracy.

An improvement has been made to the above-described TFT. That is, a thin film transistor (TFT) of a self-aligned structure which requires no alignment of the source and drain electrodes with respect to the gate electrode, because the positioning of the respective electrodes are automatically determined. A method for making the self-aligned TFT is disclosed, for example, in IEEE, Electron Device Letters Vol. EDL-3, No. 7 July 1982 by T. Kodama et al. According to this article, as illustrated in FIGS. 2 through 5, the self-alignment method makes use of a positive photoresist in order to determine the positions of the source and drain electrodes. In other words, after gate electrode 2, insulator film 3 and a-Si layer 4 are consecutively deposited on glass substrate 1 as shown in FIG. 2, a positive photoresist is laminated on a-Si layer 4 and, thereafter the light is irradiated from a bottom face of glass substrate 1. When the light is irradiated, gate electrode 2 shields the light rays and prevents the photoresist thereon from being exposed. Accordingly, a positive photoresist pattern 7, which has the same configuration as that of the gate electrode 2, is formed as shown in FIG. 3. Then, Al-film is deposited on the photoresist pattern 7 and a-Si layer 4. Then, when the photoresist pattern 7 is removed together with Al-film deposited thereon through a lift-off method, source electrode 5 and drain electrode 6 are formed, as shown in FIG. 4. This process is called a self-alignment process.

According to the above method, it is necessary to further provide an etching process for determining the width of the channel so as to provide a complete TFT. Morevoer, in order to enable the exposure process from the bottom of glass substrate 1, it is necessary to form source and drain electrodes through the self-alignment process on thin a-Si layer 4, which has the thickness of less than 200Å. Furthermore in order to produce a FET which can perform favorably, it is necessary to form a thick a-Si layer 41, which has the thickness over several thousand Å deposited thereon, as shown in FIG. 5, and thereafter, the deposited a-Si layer 41 should be covered with an insulator film 8 thereby obtaining favorable performance.

Therefore, according to the prior art process for making the TFT, the process itself is very complicated. Furthermore, the layers formed on the top surface of the glass substrate may easily be soiled or spoiled during the exposure process of light from the bottom face of the substrate. Moreover, in the case where the source and drain electrodes are formed by, e.g., Al, an etchant, such as HF, cannot be used to form patterns of the thick a-Si layer 41. Instead, the thick a-Si layer 41 should be patterned by dryetching by the use of $CF_4$. Thus, from practical viewpoint, the self-alignment process disclosed in the aforementioned article is not suitable for forming a thin film transistor array for use in a matrix-type liquid crystal display device.

SUMMARY OF THE INVENTION

Accordingly, an object of the present invention is to provide a novel arrangement of a TFT of a self-aligned structure and a method for making the same which can form the source and drain electrodes in alignment with the gate electrode, without the step of exposure from the bottom surface of the glass substrate, but through the step of low temperature diffusion or through the step of silicide formation reaction.

BRIEF DESCRIPTION OF THE DRAWINGS

These and other objects and features of the present invention will become apparent from the following description taken in conjunction with the preferred embodiments thereof with reference to the accompanying drawings, in which.

DESCRIPTION OF THE PREFERRED EMBODIMENTS

Figure 1:
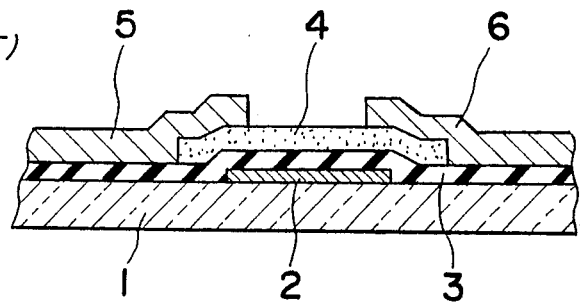
FIG. 1 is a cross-sectional view of a TFT according to the prior art.
Figure 2:
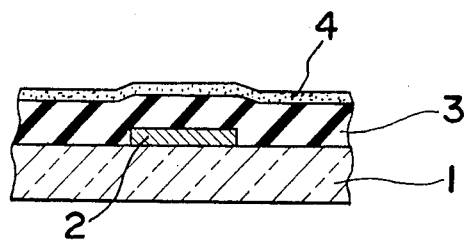
FIGS. 2 to 5 are diagrams showing the prior art self-alignment steps for making the TFT of FIG. 1.
Figure 3:
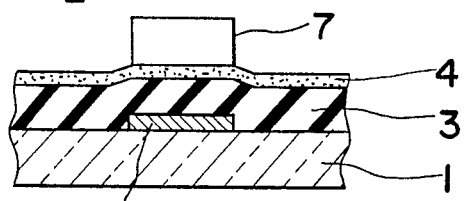
Figure 4:
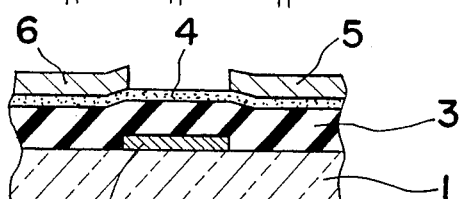
Figure 5:
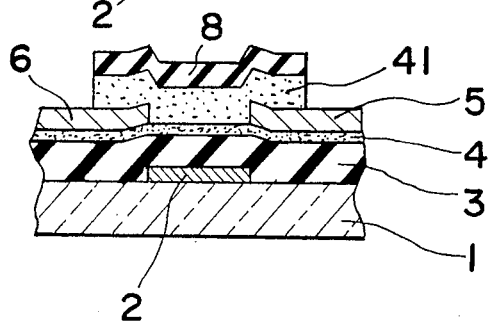
Figure 6:
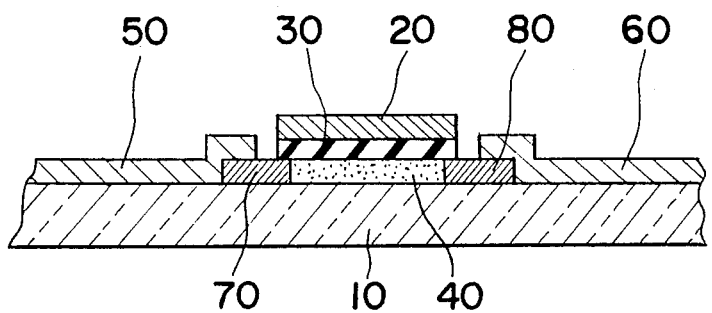
FIG. 6 is a cross-sectional view of a TFT according to one preferred embodiment of the present invention.
Figure 7:
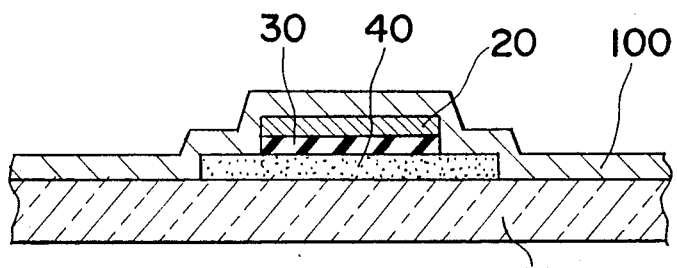
FIGS. 7 to 9 are diagrams showing the steps for making the TFT of FIG. 6.
Figure 8:
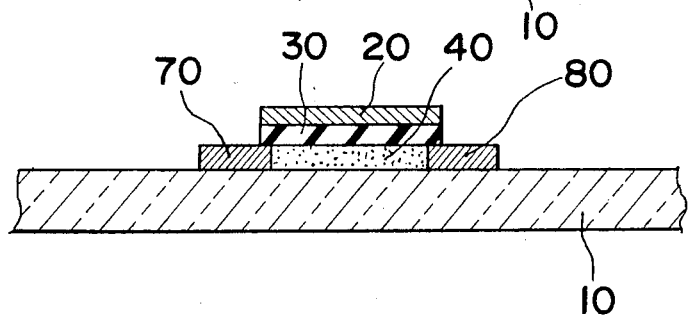

Referring to FIG. 6, a cross-sectional view of a TFT according to one preferred embodiment of the present invention is shown. The steps for making the TFT of FIG. 6 is as follows. First, on an insulating substrate 10 made of glass, quartz or the like, an a-Si (including microcrystalline silicon) layer 40 having a thickness of several thousand Å is deposited through a glow discharge decomposition of $SiH_4$. Next, the a-Si layer 40 is formed into a predetermined pattern by etching. Further, $SiO_2$ or $Si_3N_4$ film is deposited on the layer 40 by the plasma CVD method or the like, thereby defining a gate insulation film 30. Then, on the gate insulation film 30, a film made of metal, such as Ti or Mo is deposited. Then, this metal film is processed together with the gate insulation film 30 by etching so as to form a certain pattern of a gate electrode 20 exactly on top of a gate insulation film 30. Thereafter, a layer 100 made of a metal which is diffusible with respect to the a-Si layer 40, such as Al, Mg, Ni, Au, Sb or Pd, is formed by the step of a vacuum deposition, as is illustrated in FIG. 7. Then the metal layer 100 is heat-treated within the vacuum or in the inert gas at a temperature of 200°–500° C. Thereafter, the metal layer 100 is removed by etching as shown in FIG. 8, and accordingly, low resistance areas 70 and 80, where the atoms of metal have been diffused into a-Si layer 40, are formed at both side portions of the a-Si layer 40. The temperature of the heat treatment for diffusion of the metal atoms is set: below 500° C. in order to prevent hydrogen evolution from, the a-Si layer. Source and drain electrodes 50 and 60 are formed with their ends partly held in contact with the low resistance areas 70 and 80, respectively. For the material for the source and drain electrodes, metal which can be selectively etched away with respect to the material for the gate electrode (Ti, Mo, etc.), such as Al, is used. The source electrode 50 and the drain electrode 60 are formed through the steps of the deposition and etching process.

Figure 9:
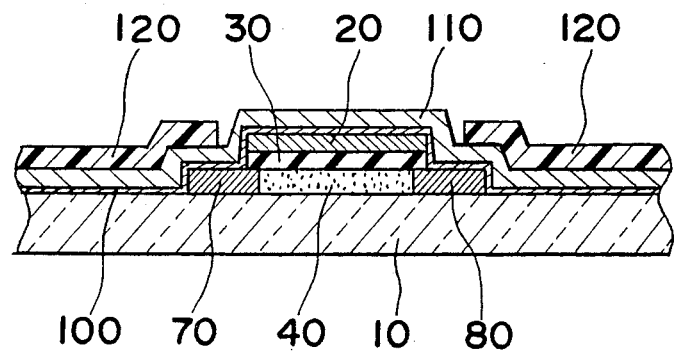

By the above described steps, a TFT shown in FIG. 6 is completed. It is to be noted that, subsequent to the formation of the low resistance areas 70 and 80, a material 110 for the source and drain electrodes may be further deposited entirely covering the metal layer 100, as shown in FIG. 9. In this case, a photoresist layer 120 in a predetermined pattern is formed to define a mask. Thereafter, by the step of etching, layers 100 and 110 are partially etched away, thereby forming the source electrode 50 and the drain electrode 60, as shown in FIG. 6.

In the case where a non-doped a-Si layer (hereinafter referred to as an i layer), wherein metal atoms are not diffused, is employed, the p-channel performance is observed in the TFT even when the n-channel performance is intended, if the TFT is heat-treated at high temperature. This is due to the fact that the electrodes so made do not prevent positive holes from being injected from the electrodes, resulting in unstable n-channel performance. However, if the i layer is doped with a very small amount of donors such as phosphorus, or if metal layer 100, made of an alloy of Al, Mg or the like added with a small amount of silicon, is used for the diffusion into the i layer, it is possible to control the TFT such that the p-channel performance can be suppressed to such an extent that the thin film transistor TFT can be practically used as a switching transistor for an x-y matrix type liquid crystal display device, etc. When magnesium (Mg) is used for the metal atom to be diffused into the i layer, no performance of the p-channel was observed.

Figure 10:
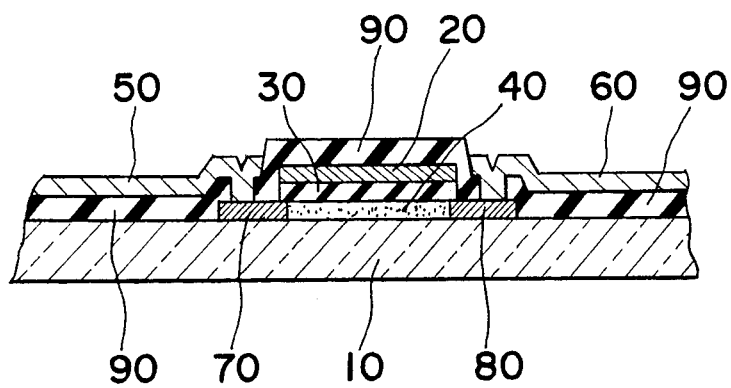
FIG. 10 is a cross-sectional view of a TFT according to a second embodiment of the present invention.
Figure 11:
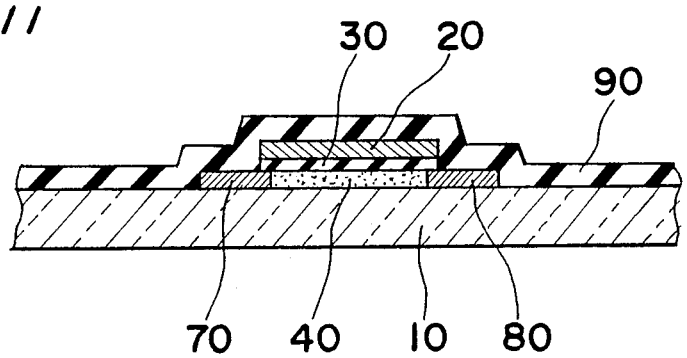
FIGS. 11 and 12 are diagrams showing the steps for making the TFT of FIG. 10.
Figure 12:
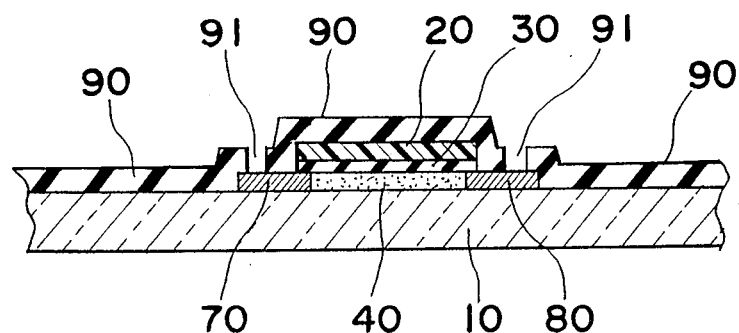

FIG. 10 shows a cross-sectional view of a TFT according to a second embodiment of the present invention. In order to make the TFT shown in FIG. 10, the same steps described above are performed to form layers shown in FIG. 8. Thereafter, an insulator film 90 made of, for example, $SiO_2$ or $Si_3N_4$ is deposited thereon, as shown in FIG. 11. The thickness of the insulator film 90 is several thousand Å to several micrometers. This insulator film 90 is then formed with contact holes 91, as shown in FIG. 12. After the metal layer, such as Ni or Al layer, is deposited over the film 90 and some part of the layer intruding into the contact holes 91, the metal layer is partly removed, thereby defining source electrode 50 and drain electrode 60 on the insulation film 90. Accordingly, the thin film transistor TFT shown in FIG. 10 is completed. The source electrode 50 and the drain electrode 60 are electrically connected with the low resistance areas 70 and 80, respectively, through contact holes 91.

According to the second embodiment, although the steps for making TFT becomes more or less complicated, the surface of the TFT can be covered by the insulation film, and therefore, a TFT with remarkably stable characteristics can be obtained.

It is to be noted that the present invention is not limited to the case where an a-Si layer is employed as a semiconductor layer, but may be applicable to the cases where compound semiconductors such as those made of GaAs, GaP and the like can be employed. Moreover, it may be applied not only in the case of an amorphous layer, but also in the cases of a microcrystalline layer and a polycrystalline layer. As is clear from FIGS. 7 and 8, the gate electrode 20 and the gate insulator film 30 serve as diffusion masks in the steps for forming low resistance areas 70 and 80 in the semiconductor layer through the low temperature diffusion of metal atoms. Therefore, the low resistance areas 70 and 80 are formed automatically in alignment with the gate electrode 20.

As is fully described in the foregoing embodiments, according to the present invention, it is possible to make through a self-alignment process a thin film transistor having patterns with considerably high resolution and having a channel length shorter than 5 micrometers, whose length has conventionally been regarded as difficult to obtain. Further, unnecessary stray capacitance between the gate electrode 20 and the source and drain electrodes can be reduced. In addition, the response speed has bee improved greatly in comparison with a conventional TFT.

Although the present invention has been fully described with reference to the preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. A method for making a thin film transistor comprising the steps of:
   forming a thin film semiconductor layer entirely on a substrate, etching said semiconductor layer into a predetermined semiconductor pattern, so as to form an etched semiconductor layer depositing, in succession, a gate insulation film and a gate electrode film entirely over said etched semiconductor layer, applying an alignment mask over said gate electrode film corresponding to said predetermined semiconductor pattern, said alignment mask forming a gate pattern for both said gate electrode film and said gate insulation film, etching said gate electrode and gate insulation films to form gate insulation and gate electrode films having self-aligned structures in said gate pattern over said semiconductor layer in said semiconductor pattern, and to form exposed portions of said semiconductor layer, removing said alignment mask, depositing a metal layer over said substrate, said semiconductor layer, said gate electrode film, and said gate insulation film, diffusing metal atoms from said metal layer into said exposed portions of said semiconductor layer, thereby forming a first and a second low resistance area, forming a source electrode by etching and deposition on said substrate, said source electrode contacting said first low resistance portion, and forming a drain electrode by etching and deposition on said substrate, said drain electrode contacting said second low resistance portion.

2. A method as claimed in claim 1, wherein said metal atoms are diffused by low temperature heat treatment, using said gate electrode film as a mask.

3. A method as claimed in claim 2, wherein said heat treatment is carried out in a vacuum.

4. A method as claimed in claim 2, wherein said heat treatment is carried out in an inert gas.

5. A method as claimed in claim 2, wherein said heat treatment is carried out at a temperature of 200° C. and 500° C.

6. A method as claimed in claim 1, wherein said semiconductor layer is formed by glow discharge decomposition of $SiH_4$, said gate insulation film is deposited by plasma CVD, and said metal layer is deposited by vacuum deposition.

7. A method as claimed in claim 6, wherein said substrate comprises glass or quartz, said semiconductor layer comprises microcrystalline silicon, said gate insulation film comprises $SiO_2$ or $Si_3N_4$, said gate electrode film comprises Ti or Mo, and said metal layer comprises Al, Mg, Ni, Au, Sb, or Pd.

8. A method as claimed in claim 1, wherein said source and drain electrodes comprise aluminum.

9. A method as claimed in claim 1, wherein after said diffusing step, a second layer is formed on said metal layer, a photoresist layer is formed in a predetermined pattern as a mask over said second layer, and said metal layer and said second layer are etched to form said source and drain electrodes.

10. A method as claimed in claim 1, wherein after said diffusing step, said metal layer is removed, an insulator film is formed over said substrate and said gate electrode, contact holes are formed in said insulator film to expose said first and second low resistance portions, an electrode layer is formed over said insulator film, and part of said electrode layer is removed to form said source and drain electrodes from said electrode layer.

11. A method as claimed in claim 10, wherein said insulator film comprises $SiO_2$ or $Si_3N_4$ and said electrode layer comprises Ni or Al.

12. A method as claimed in claim 1, wherein said semiconductor layer is amorphous, microcrystalline, or polycrystalline.

13. A method as claimed in claim 1, wherein said semiconductor layer comprises GaAs or GaP.

* * * * *